United States Patent
Schouwenburg

(10) Patent No.: US 9,245,061 B2
(45) Date of Patent: Jan. 26, 2016

(54) WEIGHT-BASED IDENTIFICATION OF THREE DIMENSIONAL PRINTED PARTS

(71) Applicant: SHAPEWAYS, INC., New York, NY (US)

(72) Inventor: Robert D. Schouwenburg, Brooklyn, NY (US)

(73) Assignee: SHAPEWAYS, INC., New York, NY (US)

( * ) Notice: Subject to any disclaimer, the term of this patent is extended or adjusted under 35 U.S.C. 154(b) by 496 days.

(21) Appl. No.: 13/708,135

(22) Filed: Dec. 7, 2012

(65) Prior Publication Data

US 2013/0310965 A1    Nov. 21, 2013

Related U.S. Application Data

(63) Continuation of application No. 13/455,286, filed on Apr. 25, 2012, now abandoned.

(51) Int. Cl.
*G06F 17/50* (2006.01)
*G01G 17/00* (2006.01)
*G01G 19/414* (2006.01)

(52) U.S. Cl.
CPC .............. *G06F 17/50* (2013.01); *G01G 17/00* (2013.01); *G01G 19/414* (2013.01)

(58) Field of Classification Search
CPC ....... G06F 17/50; G01G 17/00; G01G 19/414
See application file for complete search history.

(56) References Cited

U.S. PATENT DOCUMENTS

| | | | | |
|---|---|---|---|---|
| 4,239,434 A | * | 12/1980 | Gannon | 198/349.8 |
| 4,509,123 A | | 4/1985 | Vereen | |
| 5,410,109 A | * | 4/1995 | Tarter et al. | 177/136 |
| 5,518,122 A | * | 5/1996 | Tilles et al. | 209/539 |
| 5,594,652 A | * | 1/1997 | Penn et al. | 700/119 |
| 5,644,687 A | * | 7/1997 | Agonafer et al. | 345/419 |
| 5,831,859 A | * | 11/1998 | Medeiros et al. | 700/218 |
| 6,598,791 B2 | | 7/2003 | Bellis, Jr. et al. | |
| 6,655,421 B2 | | 12/2003 | Kohashi et al. | |
| 6,956,465 B2 | | 10/2005 | Meyer et al. | |
| 7,085,677 B1 | | 8/2006 | Champlin et al. | |
| 7,311,250 B1 | * | 12/2007 | Herwig | 235/383 |
| 7,320,205 B2 | | 1/2008 | Cooper et al. | |
| 7,380,213 B2 | | 5/2008 | Pokorny et al. | |
| 7,411,500 B2 | | 8/2008 | Hamerly et al. | |
| 7,416,119 B1 | * | 8/2008 | Inderrieden | 235/383 |
| 7,516,898 B2 | * | 4/2009 | Knowles et al. | 235/462.42 |
| 8,001,677 B2 | | 8/2011 | Dixon et al. | |
| 2006/0038007 A1 | | 2/2006 | Dickover et al. | |
| 2006/0043174 A1 | | 3/2006 | Banavar et al. | |
| 2006/0106742 A1 | * | 5/2006 | Bochicchio et al. | 705/414 |
| 2007/0005379 A1 | | 1/2007 | Juan-Castellanos et al. | |
| 2008/0147344 A1 | | 6/2008 | Kwok et al. | |
| 2008/0211633 A1 | | 9/2008 | Oh et al. | |
| 2009/0125406 A1 | | 5/2009 | Lewis et al. | |
| 2010/0147049 A1 | * | 6/2010 | Haussmann et al. | 73/1.13 |
| 2010/0150458 A1 | * | 6/2010 | Angell et al. | 382/224 |
| 2010/0327001 A1 | | 12/2010 | Godlewski | |
| 2010/0332005 A1 | | 12/2010 | Lemelin et al. | |
| 2011/0087350 A1 | * | 4/2011 | Fogel et al. | 700/98 |

\* cited by examiner

*Primary Examiner* — Ramesh Patel
(74) *Attorney, Agent, or Firm* — Lando & Anastasi, LLP

(57) ABSTRACT

Methods and systems for weight-based identification of three dimensional (3D) printed parts. Various embodiments disclosed herein may permit reliable processing of 3D printed parts to effectively scale a 3D printing service to large volumes of orders for 3D printed parts.

28 Claims, 8 Drawing Sheets

Trays Overviews

| Name | Date ▲ | Items | Actions |
|---|---|---|---|
| 2012010901 | 2012-01-09 | 76 | Weight-based Sorting |
| 2012010802 | 2012-01-08 | 120 | Weight-based Sorting |
| 2012010801 | 2012-01-08 | 116 | Weight-based Sorting |
| 2012010704 | 2012-01-07 | 84 | Weight-based Sorting |

WEIGHT-BASED IDENTIFICATION OF THREE DIMENSIONAL PRINTED PARTS

CROSS-REFERENCE TO RELATED APPLICATIONS

This application is a Continuation of application Ser. No. 13/455,286 entitled "WEIGHT-BASED IDENTIFICATION OF THREE DIMENSIONAL PRINTED PARTS" filed on Apr. 25, 2012, of which application is herein incorporated by reference in its entirety.

BACKGROUND

1. Field of the Disclosure

The present disclosure relates generally to three dimensional (3D) printing and processing of 3D printed parts. More specifically, embodiments of this disclosure relate to methods and systems for identification of 3D printed parts.

2. Description of Background 3D printing generally refers to the process of creating a 3D part from a 3D model by printing material layers to create the 3D part. A 3D model from which a 3D part is printed may be any 3D-printable digital model such as a computer-aided design (CAD) model. On-demand 3D printing of custom 3D models has become possible in recent years. For example, there are online services that offer custom 3D printing services. For instance, the online provider Shapeways provides custom 3D printing services wherein customers may upload custom 3D models, select materials and order 3D printed parts to be built from the selected materials.

SUMMARY OF INVENTION

In a typical on-demand 3D printing process, a 3D model, such as a custom model uploaded by a customer submitting an order, may be assigned to a manufacturer based on the ordered material, shipping location of the customer and available capacity at the manufacturer. The manufacturer may analyze the 3D model to determine whether it is 3D-printable. If the model is printable on a 3D printer, the manufacturer may accept the 3D model and queue it for production planning. Production planning plans 3D print runs, i.e. the build of 3D models. After production planning, one or more 3D parts based on the 3D model may be scheduled to be built inside a tray. Other 3D parts to be built based on other 3D models may also be assigned to the same tray. For example, a tray may be used to build 50-800 3D parts from various 3D models. The tray is then assigned to a 3D printer. After 3D printing, the tray contains multiple 3D printed parts, and these 3D parts may correspond to different 3D models and may also correspond to different customer orders. Therefore, each of the 3D printed parts in a typical tray must be identified so that the parts may be correctly distributed and shipped to customers. As the demand for 3D printing services continues to grow, manufacturers of 3D printed parts need to efficiently process large numbers of 3D printed parts. The identification of a 3D printed part may be achieved by identifying the corresponding 3D model which was used to print that part, thereby matching the 3D printed part with the corresponding 3D model. The process of identifying 3D printed parts within each tray used for 3D printing may be referred to as tray sorting.

Tray sorting is particularly challenging when large numbers of 3D printed parts are to be identified. Typically, an operator of the manufacturing facility identifies each 3D printed part within a tray based on a contact sheet made for that tray. A contact sheet is made per tray that is to be sorted. The contact sheet for a tray may include images associated with 3D models assigned to that tray, i.e. 3D models used to build the 3D parts in that tray. The operator identifies each 3D printed part by visually matching the part to an image listed on the contact sheet.

The contact sheet may also include a barcode associated with each 3D model. Upon identifying a 3D printed part, the operator may scan a barcode associated with the matching 3D model for that part, so as to update the status of the part in a computer system and to generate an order card for that part.

According to one aspect of the invention, it is appreciated that approaches of identifying 3D printed parts is both time consuming and unreliable. For example, a large number of images corresponding to a large number of 3D models may be listed on the contact sheet, thereby making it difficult for the operator to quickly and reliably identify the correct match for a given 3D printed part. Therefore, there is a need to identify 3D printed parts efficiently and reliably in order to effectively scale a 3D printing service to process large volumes of orders for 3D printed parts.

Aspects and embodiments disclosed herein are directed to providing methods and systems for weight-based identification of 3D printed parts. Various embodiments of the present invention relate to methods and systems that enable efficient and reliable identification of 3D printed parts. Some embodiments may be implemented on a computer system and may provide a convenient user interface to an operator of a manufacturing facility that supplies large quantities of 3D printed parts. According to some embodiments, a system may automatically select a subset of 3D models that may match a 3D printed part based on the weight of the part and theoretical weights computed for each 3D model based on the volume of the 3D model and the density of the material used to print the part. Compared to the typical process where the operator uses a contact sheet to identify the 3D printed parts, some methods and systems of the present disclosure may speed up the process of identifying the parts and increase the identification reliability.

One aspect of the present disclosure is directed to providing a computer-implemented method for weight-based identification of a three dimensional (3D) printed part, the 3D printed part being printed from a 3D model using a preselected material, the method comprising acts of receiving, by a computer system, an indication of a weight of the 3D printed part; calculating, by the computer system, a plurality of theoretical weights for a plurality of 3D models, each theoretical weight being calculated for a respective 3D model based on a volume of the respective 3D model and a density of the preselected material; comparing the indication of the weight to the plurality of theoretical weights; and selecting a subset of the plurality of 3D models based on a result of the comparing act, the subset having a size less than a total number of the plurality of 3D models. In one embodiment, the act of selecting a subset may further include an act of selecting a 3D model to include in the subset responsive to an act of determining that a deviation of the theoretical weight of the 3D model from the indication of the weight of the 3D printed part does not exceed a predetermined threshold value. In one embodiment, the method may further comprise an act of sorting the subset based on a respective value of deviation of a respective theoretical weight of each 3D model within the subset from the indication of the weight of the 3D printed part. In one embodiment, the method may further comprise an act of receiving the size of the subset.

In one embodiment, the method may further comprise acts of outputting the subset and receiving a selection of the 3D model corresponding to the 3D printed part from the subset. In one embodiment, the method may further comprise generating a label for the 3D printed part based on the selection of the 3D model. The label may include at least one of a barcode, a model number of the 3D model and an order number for the 3D printed part.

In one embodiment, the method may further comprise acts of receiving a selection of a tray, the 3D printed part being one of a plurality of 3D printed parts built inside the tray, and selecting the plurality of 3D models based on the selection of the tray. The method may further comprise removing a 3D model corresponding to an identified 3D printed part from the plurality of 3D models.

Another aspect of the present disclosure is directed to providing a system for weight-based identification of a three dimensional (3D) printed part, the 3D printed part being printed from a 3D model using a preselected material, the system comprising a memory; and a processing unit coupled to the memory, wherein the processing unit is operative to receive an indication of a weight of the 3D printed part; calculate a plurality of theoretical weights for a plurality of 3D models, each theoretical weight being calculated for a respective 3D model based on a volume of the respective 3D model and a density of the preselected material; compare the indication of the weight to the plurality of theoretical weights; and select a subset of the plurality of 3D models in response to comparing the indication of the weight to the plurality of theoretical weights, the subset having a size less than a total number of the plurality of 3D models. In one embodiment, the processing unit being operative to select a subset further includes the processing unit being operative to select a 3D model for inclusion in the subset responsive to a determination that a deviation of the theoretical weight of the 3D model from the indication of the weight of the 3D printed part does not exceed a predetermined threshold value. In one embodiment, the processing unit is further operative to sort the subset based on a respective value of deviation of a respective theoretical weight of each 3D model within the subset from the indication of the weight of the 3D printed part. In one embodiment, the processing unit is further operative to receive the size of the subset.

In one embodiment, the processing unit is further operative to output the subset and receive a selection of the 3D model corresponding to the 3D printed part from the subset. In one embodiment, the system may further comprise a printer configured to print a label for the 3D printed part based on the selection of the 3D model.

In one embodiment, the processing unit is further operative to receive a selection of a tray, the 3D printed part being one of a plurality of 3D printed parts built inside the tray, and select the plurality of 3D models based on the selection of the tray. In one embodiment, the processing unit is further operative to remove a 3D model corresponding to an identified 3D printed part from the plurality of 3D models.

Another aspect of the present disclosure is directed to providing a computer-readable storage medium that stores a set of instructions which when executed perform a method for weight-based identification of a three dimensional (3D) printed part, the 3D printed part being printed from a 3D model using a preselected material, the method executed by the set of instructions comprising receiving an indication of a weight of the 3D printed part; calculating a plurality of theoretical weights for a plurality of 3D models, each theoretical weight being calculated for a respective 3D model based on a volume of the respective 3D model and a density of the preselected material; comparing the indication of the weight to the plurality of theoretical weights; and selecting a subset of the plurality of 3D models based on a result of comparing, the subset having a size less than a total number of the plurality of 3D models.

Another aspect of the present disclosure is directed to providing a method for weight-based identification of a three dimensional (3D) printed part, the 3D printed part being printed from a 3D model using a preselected material, the method comprising acts of weighing the 3D printed part to generate an indication of a weight of the 3D printed part; calculating a plurality of theoretical weights for a plurality of 3D models, each theoretical weight being calculated for a respective 3D model based on a volume of the respective 3D model and a density of the preselected material; comparing the indication of the weight to the plurality of theoretical weights; and selecting a subset of the plurality of 3D models based on a result of the comparing act, the subset having a size less than a total number of the plurality of 3D models. In one embodiment, the selecting act further includes an act of selecting the subset responsive to an act of determining that a deviation of a theoretical weight of a 3D model from the indication of the weight of the 3D printed part does not exceed a predetermined threshold value. The method may further comprise an act of sorting the subset based on a respective value of deviation of a respective theoretical weight of each 3D model within the subset from the indication of the weight of the 3D printed part. The method may further comprise an act of selecting the size of the subset.

In one embodiment, the method may further comprise an act of cleaning the 3D printed part prior to the weighing act. In one embodiment, the 3D printed part may be one of a plurality of 3D printed parts built inside a tray, the plurality of 3D models corresponding to the plurality of 3D printed parts built inside the tray.

In one embodiment, the method may further comprise an act of identifying the 3D model corresponding to the 3D printed part from the subset of the plurality of 3D models. In one embodiment, the identifying act may further include an act of visually comparing at least one 3D model in the subset to the 3D printed part. In one embodiment, the method may further comprise an act of adding a label to the 3D printed part following the identifying act. The method may further comprise an act of routing the 3D printed part to one or more locations in response to the identifying act.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIG. 2 is a display illustrating one example of a user interface including a listing of trays in a computer system implementing weight-based identification of 3D printed parts according to aspects of the present invention;

DETAILED DESCRIPTION

Aspects and embodiments are directed to providing efficient and reliable methods for identification of 3D printed parts based on weight. Other aspects and embodiments are directed to systems that implement identification of 3D printed parts based on weight. Efficiency and reliability may be achieved by providing embodiments that enable automatically selecting a subset of 3D models that may correspond to a 3D printed part, based on the weight of the 3D printed part.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiment.

Also, the phraseology and terminology used herein is for the purpose of description and should not be regarded as limiting. Any references to embodiments or elements or acts of the systems and methods herein referred to in the singular may also embrace embodiments including a plurality of these elements, and any references in plural to any embodiment or element or act herein may also embrace embodiments including only a single element. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Figure 1:
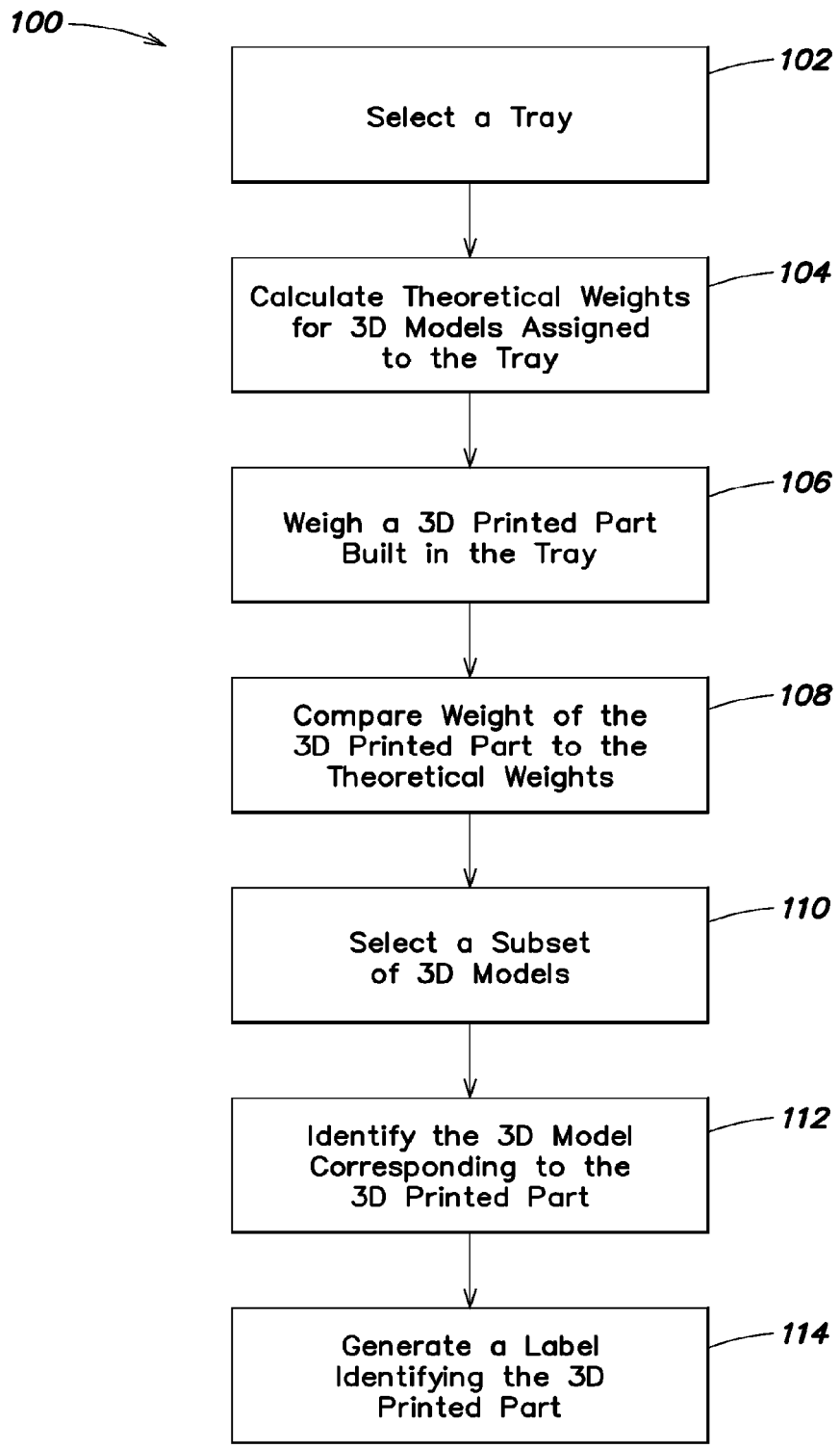
FIG. 1 is a flow chart illustrating an exemplary embodiment of a process for weight-based identification of 3D printed parts according to aspects of the present invention.

Referring to FIG. 1, there is illustrated one example of a process 100 for weight-based identification of 3D printed parts according to aspects disclosed herein. Process 100 may be fully or partially implemented in a computer system. In one example, process 100 may be executed by a set of instructions that may be stored on a computer readable storage medium. Process 100 may be implemented, for instance, in software, hardware, or combination thereof used by an operator of a manufacturing facility to efficiently identify 3D printed parts.

At block 102 of process 100 in FIG. 1, a tray to be sorted is selected. Tray sorting generally refers to identifying 3D printed parts in each tray after the parts are built in the tray. The tray may include one or more 3D printed parts built based on one or more 3D models. The one or more 3D printed parts in a tray may also correspond to one or more customer orders. In one example, the tray may be selected by a user or operator and the selection of the tray may be input to the computer system implementing weight-based identification. In some embodiments, selecting a tray at block 102 may include selecting or identifying a material and a density of the material used for 3D printing in that tray. In one embodiment, the computer system may be configured to automatically identify the material and associated density used for 3D printing in a selected tray, for example, by retrieving stored material and associated density corresponding to the selected tray. A list of 3D printing materials may be stored in the computer system. Density may also be stored in the computer system as a material property for each 3D printing material.

Still referring to FIG. 1, at block 104 of process 100, theoretical weights may be calculated for one or more 3D models. In the embodiment shown in FIG. 1, the 3D models for which theoretical weights are calculated may include all the 3D models assigned to the tray selected at block 102. A 3D model assigned to a tray may be used to build a corresponding 3D part in that tray. In one embodiment, selecting a tray at block 102 may result in selection of one or more 3D models assigned to the selected tray for use at block 104.

In one practical example, a group of 1000 3D models that are assigned to a single tray selected at block 102 may be selected for use at block 104. However, the one or more 3D models used at block 104 may generally include any of the 3D models that were used to print 3D parts in any tray.

A theoretical weight for a 3D model at block 104 may be calculated by multiplying the volume of the 3D model by the density of the material used to print the 3D model in the selected tray. In one example, the density of the material may be automatically identified upon selecting a tray at block 102. In one embodiment, block 104 may be performed only once per selected tray. If the selected tray includes 3D parts made from different materials, block 104 may be performed for each 3D printed part based on the density of the material used to print that part.

At block 106 of process 100, a 3D printed part that was built in the selected tray may be weighed. In one example, the 3D printed part may be weighed by using a scale. The 3D printed part is weighed after cleaning the part to eliminate any residual weight. Cleaning may be performed prior to selecting the tray at block 102 or prior to weighing the 3D part at block 106. In other embodiments, if cleaning does not precede weight-based identification, the process of weight-based identification may compensate for an estimated weight of residue.

In one embodiment, a 3D printed part from the selected tray may be weighed by a user or operator and the weight may be input to the computer system implementing weight-based identification. At block 108, the weight of the 3D printed part may be compared to the theoretical weights calculated for one or more 3D models. In one embodiment, the comparison may include calculating, for each 3D model used at block 104, a value representing a deviation of the theoretical weight of the 3D model from the weight of the 3D printed part provided at block 106. In one example, the values may be absolute values. The comparison may further include checking, for each 3D model used at block 104, whether a value representing a deviation of its theoretical weight from the weight of the 3D printed part is within a predetermined threshold value of deviation from the weight of the 3D printed part.

At block 110 of process 100, a subset of 3D models may be selected from one or more models used at block 104. The number of 3D models in the subset may be less than the total number of 3D models used at block 104. The number of 3D models in the subset, i.e. the size of the subset, may be predetermined. In one example, the size may be selected by a user of the weight-based identification process. The subset of 3D models is selected based on comparing, at block 108, the weight of the 3D printed part with the theoretical weights of one or more 3D models. In one example, a 3D model may be selected for inclusion in the subset of 3D models if a value of deviation of its theoretical weight from the weight of the 3D printed part is within a predetermined threshold value of deviation.

In one embodiment, selecting a subset of 3D models in at block 110 may further include sorting the 3D models within the subset. Sorting the subset of 3D models may be included within block 110 or as a separate block of process 100. In one example, the 3D models in the subset may be sorted based on values of deviation of their respective theoretical weights from the weight of the 3D printed part. For example, the subset may be sorted such that the first 3D model in the sorted subset has the smallest value or amount of deviation from the weight of the 3D printed part, thereby being the closest match to the 3D printed part based on weight.

In a computer implementation of process 100, the selected subset of 3D models may at least partially be output or presented to a user or operator. In one example, a first subset of 3D models may be presented to the user. Upon receiving a request from the user for more 3D models that may match the 3D printed part, a next subset of 3D models may be presented to the user. The user may switch between viewing the different subsets and may select one or more 3D models for viewing. At block 112 of process 100, the 3D model that corresponds to the 3D printed part is identified. Block 112 may include comparing 3D models in the subset of block 110 to the 3D printed part. In one embodiment, the comparison may include visual comparison to identify the 3D model that matches the 3D printed part. In one example, the subset of 3D models at block 110 may only include a single 3D model, and at block 112, the selected 3D model may be confirmed to match the 3D printed part.

Figure 5:
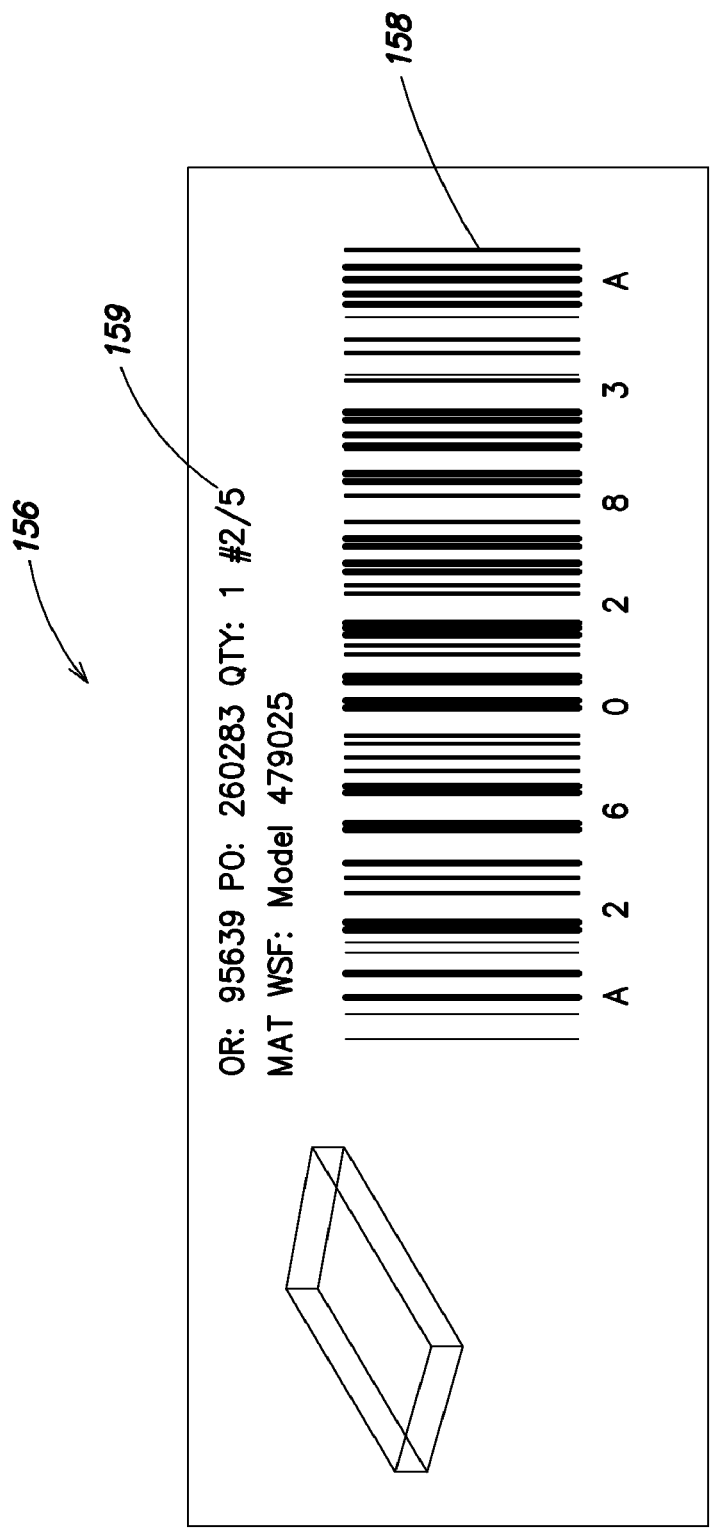
FIG. 5 illustrates one example of a label for a 3D printed part according to aspects of the present invention.

Once the 3D model from which the 3D printed part has been printed is identified at block 112, a label corresponding to the 3D printed part may be generated at block 114. The label may include information identifying the 3D printed part. For example, the label may be an order card and may include customer order information, a barcode, the 3D model number that matches the 3D printed part and a code for the material used to print the part (e.g., as shown in FIG. 5 and discussed further below).

The label may also include a storage bin number corresponding to the 3D printed part. Generating the label may include printing the label and may also include affixing or adding the label to the 3D printed part or a packaging thereof. In some embodiments, process 100 may further include removing an identified 3D printed part from the tray and removing a 3D model corresponding to the identified 3D printed part from the set of one or more 3D models used in process 100. Removing 3D models from the set of one or more 3D models used for weight based identification of 3D printed parts in a tray may increase the efficiency of weight based identification over time. In some embodiments, process 100 may further include updating a status of the 3D printed part. For example, in a computer system implementation, the status of the 3D printed part may be updated to indicate that the part has been identified or to indicate that a label has been printed for the part. The 3D printed part may be routed to one or more locations using the label. For example, the 3D printed part may be routed from the manufacturing facility to a distribution center, where it may be collected along with any other 3D printed parts from the same customer order and shipped to the customer.

FIG. 2 illustrates a user interface 120 including a listing of trays in a computer system implementing weight-based identification of 3D printed parts according to aspects of the present disclosure. In one example, interface 120 may be in the form of a table, as shown in FIG. 2. The interface may include a listing of trays as shown in column 122. Column 124 lists a date of 3D printing corresponding to each tray. As shown, the listing of trays in column 122 may be sorted by dates of 3D printing in column 124. In one example, the last tray emerging from the 3D printing process may be listed first.

Column 126 lists number of items corresponding to each tray. In one example, the number of items in a tray may correspond to the number of 3D printed parts built in that tray. In another example, the number of items may correspond to a sum of the quantity of production orders assigned to that tray, where a production order is a request to produce one or more copies of a 3D part from a single 3D model. Column 128 of interface 120 lists a weight-based sorting feature available for trays that are not yet sorted. In one example, a weight-based sorting feature corresponding to a tray may be selected to launch a computer implemented method for weight-based identification of 3D printed parts in the corresponding tray. In another example, a tray may be selected from the listing of trays that are available for weight-based sorting. Selecting a tray may launch another user interface for weight-based identification of 3D printed parts in the selected tray.

Figure 3:
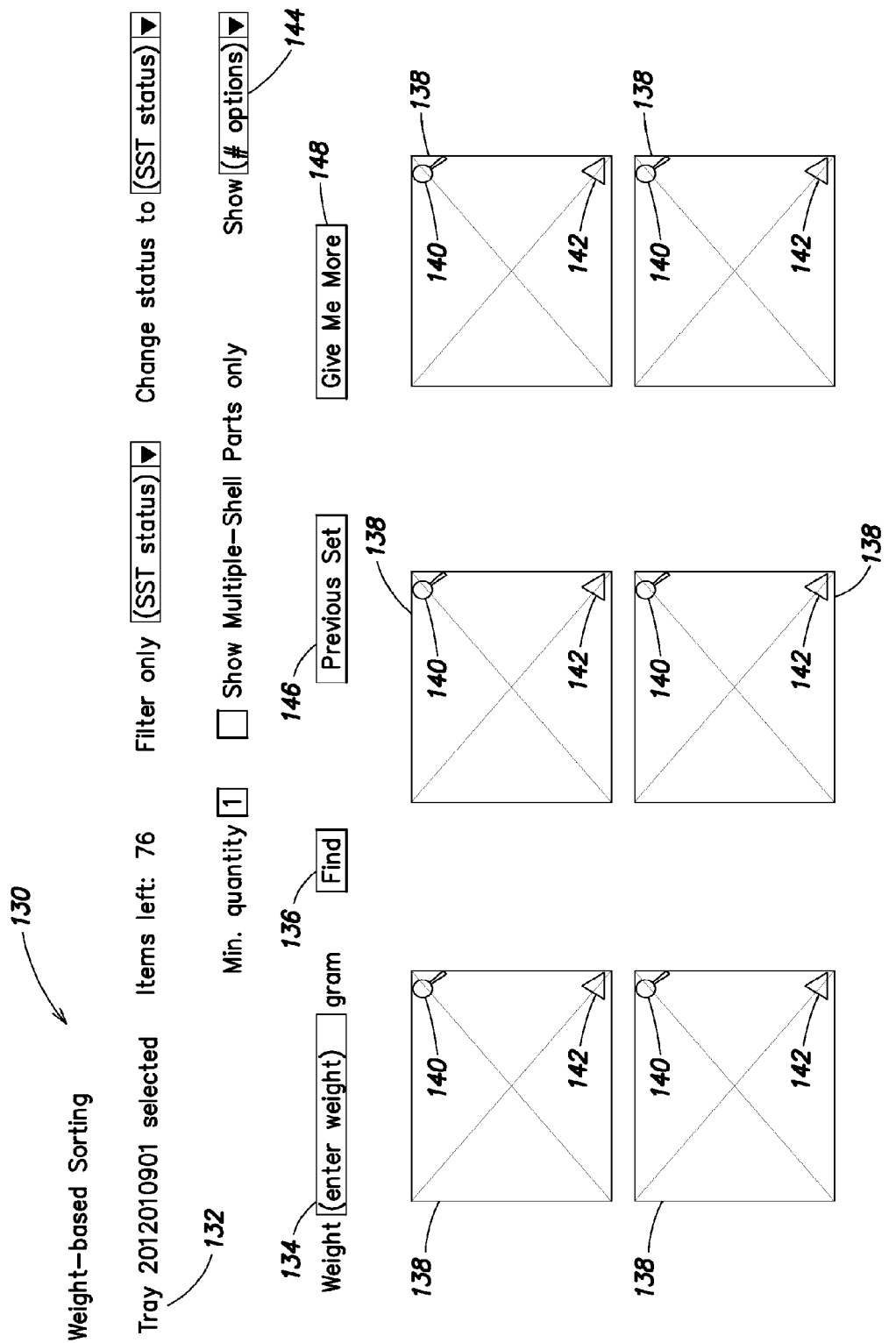
FIG. 3 is a display illustrating one example of a user interface for outputting a subset of 3D models in a computer system implementing weight-based identification of 3D printed parts according to aspects of the present invention.

FIG. 3 illustrates a user interface 130 for weight-based sorting of a selected tray 132. The tray 132 may be selected using the interface 120 in FIG. 2. Interface 130 provides an input cell 134 to receive a value indicative of the weight of the 3D printed part. In one example, an operator may enter the weight of a 3D printed part. In another example, a system including the user interface 130 may be configured to obtain a weight of a 3D printed part.

The user interface 130 may provide a button 136 configured to launch weight-based identification of the 3D printed part corresponding to the entered weight. In one embodiment, clicking on button 136 may result in performing process 100 at blocks 106 and 108 in FIG. 1. The weight entered in input cell 134 may be compared to one or more of theoretical weights calculated for one or more 3D models assigned to the selected tray 132. In response to the comparison, a subset of 3D models having theoretical weights that are closest matches to the weight entered in input cell 134 may be selected. Each 3D model in the selected subset may be displayed or output in a respective 3D model window 138 of the user interface 130. In one example, the 3D model windows 138 may be thumbnails. Each 3D model window 138 may include a zoom button 140 configured to launch the 3D model in a larger overlay window. Each 3D model window 138 may also include a 3D model viewer button 142 configured to launch a 3D viewer application.

The number of 3D model windows 138 displayed on the user interface 130 may be selected from a menu 144 including predetermined choices. In one example, the predetermined number of 3D models to be output may be chosen to be one of 6, 24 and 60 3D models. However, any other number may be provided for selection in menu 144. In the example shown in FIG. 3, 6 3D models are selected, thereby resulting in the display of the 6 3D model windows 138. In one embodiment, the user interface 130 may be configured to receive as input any number representing the size of the subset of 3D models, wherein the number is less than the total number of 3D models assigned to the selected tray 132. The user interface 130 may also include buttons 146 and 148 configured to switch between displaying a first subset and a second subset of 3D models selected based on the weight in input cell 134. In one example, the selected subset of 3D models may be sorted such that the first subset of 3D models that are displayed in user interface 130 more closely match the weight in input cell 134 compared to the second subset of 3D models.

Figure 4:
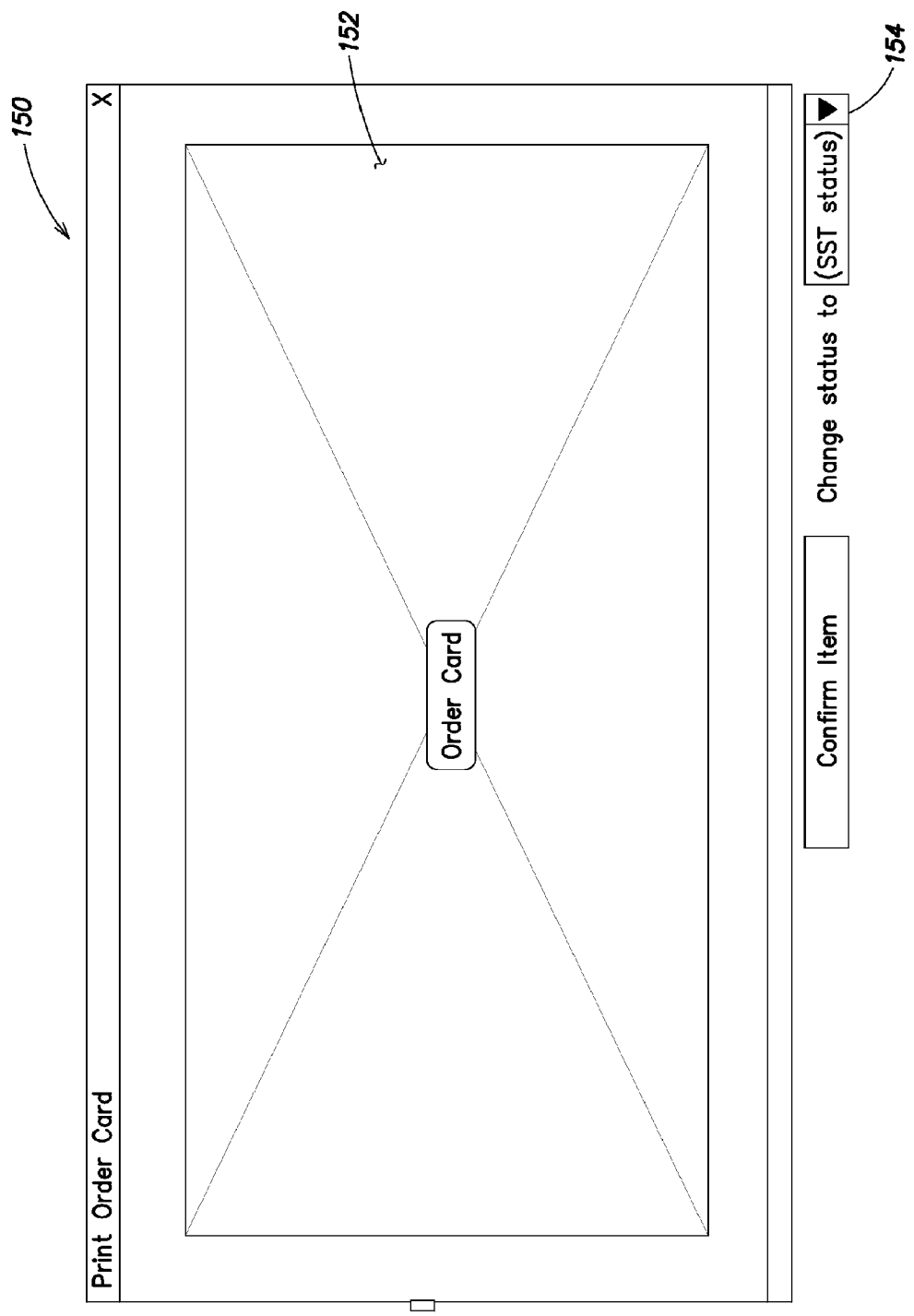
FIG. 4 is a display illustrating one example of a user interface for generating an order card in a computer system implementing weight-based identification of 3D printed parts according to aspects of the present invention.

A user may identify the 3D model that matches the 3D printed part having a weight entered in input cell 134 from a displayed subset of 3D model windows 138 in FIG. 3. Once the 3D model corresponding to the 3D printed part is identified, the user may request generating a label for the part. FIG. 4 shows one example of a user interface 150 for printing an order card for an identified 3D printed part. The order card may include identifying information for the part. The order card may be generated and displayed in an area 152 of the user interface 150. The user interface 150 may also provide an interface 154 for updating the status of the 3D printed part. After identifying a 3D printed part, the number of parts left to be identified in a single tray may be reduced. In one example, the number of items corresponding to a tray, as shown in column 126 of FIG. 2, may be reduced as 3D printed parts are identified in that tray.

FIG. 5 illustrates one example of an order card printed as a label 156. The label 156 includes a barcode 158. In one example, the barcode corresponds to the 3D model that matches the 3D printed part. Label 156 also includes a section 159 having information identifying the 3D printed part. The identifying information may include a customer order number, production order information, a material code corresponding to the material used to 3D print the part, and a 3D model number corresponding to the part. In other examples, the label may include other identifying data.

Figure 6:
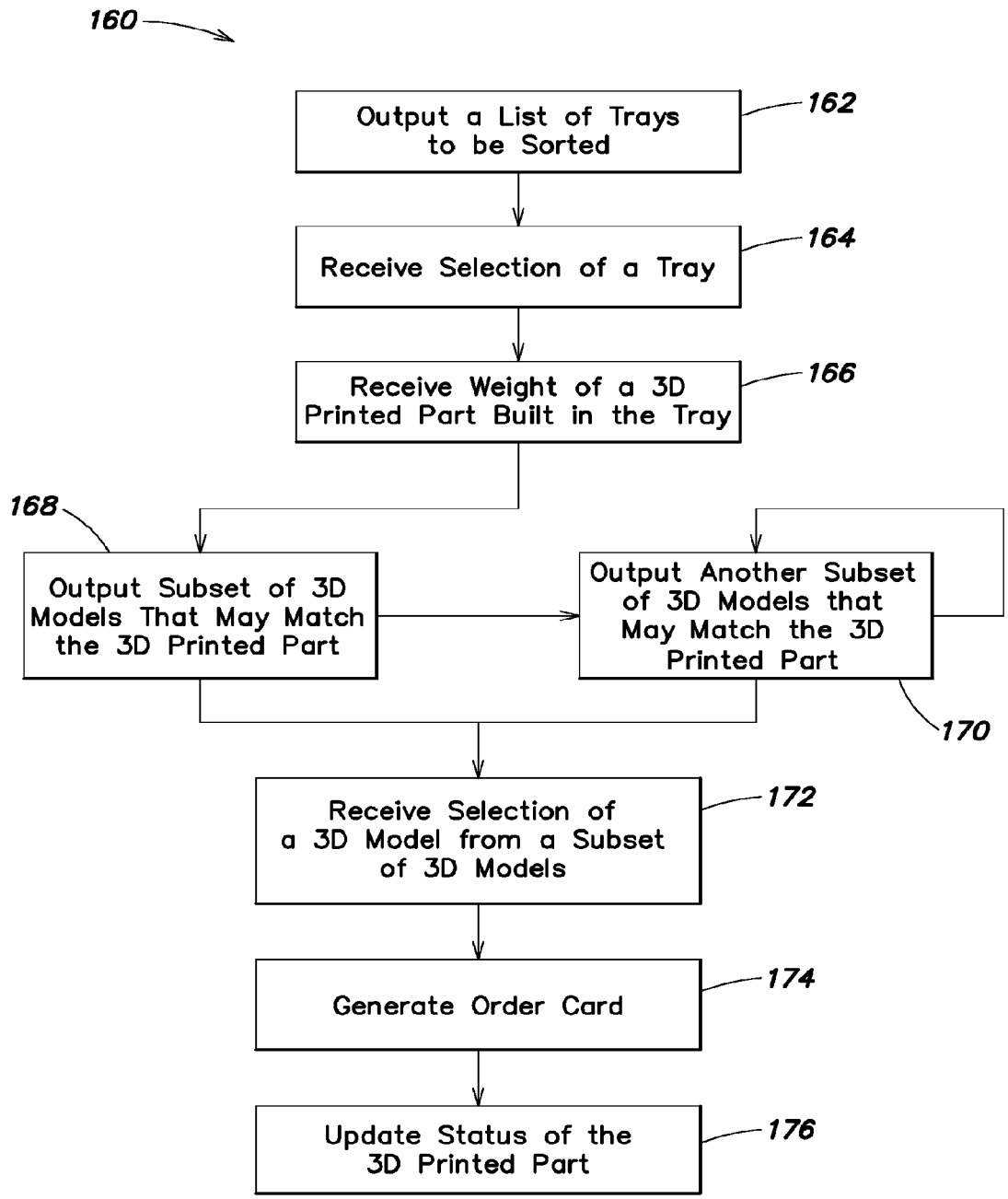
FIG. 6 is a flow chart illustrating an exemplary process of interacting with a user of the computer implemented user interfaces in FIGS. 3, 4 and 5.

FIG. 6 is a flow chart illustrating a computer implemented process 160 of interacting with a user of a weight-based identification system having the user interfaces in FIGS. 3, 4 and 5. At block 162, a list of trays to be sorted may be output, for example, by providing the user interface 120 and a listing of trays as shown in column 122 of FIG. 2. At block 164, a selection of a tray may be received from a user. For example, the user may select a tray for weight-based sorting using the user interface 120 in FIG. 2. In response to selecting a tray, process 160 may include launching a user interface 130 as shown in FIG. 3, for weight-based sorting of the selected tray.

At block 166 of process 160, a weight of a 3D printed part built in the tray may be received. The weight may be received using, for example, the input cell 134 in FIG. 3. Process 160 may include, at block 168, outputting a subset of 3D models that are closest matches to the 3D printed part having the input weight. Additional subsets of 3D printed parts may be output at block 170. For example, buttons 146 and 148 of the user interface 130 in FIG. 3 may be used to output additional subsets of 3D models and to switch among displaying the different subsets of 3D models. Process 160 may include receiving a selection of a 3D model from a subset of 3D models at block 172. For example, a 3D model displayed in a 3D model window 138 of user interface 130 may be selected. A 3D model may be selected for viewing. Selecting a 3D model may include visually comparing the 3D model to the 3D printed part and identifying the 3D model corresponding to the part.

At block 174 of process 160, an order card may be generated for the identified part. For example, an order card may be generated using the interface 150 of FIG. 5. Generating an order card may include printing the order card. Process 160 may further include updating the status of the identified 3D printed part at block 176. For example, interface 154 of FIG. 4 may be used at block 176. In some embodiments, process 160 may further include removing a 3D model corresponding to the identified 3D printed part from one or more 3D models used for weight based identification. Embodiments of the processes disclosed herein, such as process 100 in FIG. 1 and process 160 in FIG. 6 may be implemented in a software system that supports the production process for 3D printing at a manufacturing facility. The software system may generally allow tracking of 3D printed parts through the production process and may support processes involved in handling 3D printed parts. For example, the software system may support handling of 3D model files, creating production plans and sending shipments of 3D printed parts to distribution centers. The user interfaces 120, 130 and 150 may be provided to facilitate interaction with an operator of the manufacturing facility.

Processes described above are merely illustrative embodiments of systems for weight-based identification of 3D printed parts. Such illustrative embodiments are not intended to limit the scope of the present invention, as any of numerous other implementations for performing the invention. None of the claims set forth below are intended to be limited to any particular implementation of a process of weight-based identification, unless such claim includes a limitation explicitly reciting a particular implementation.

Processes associated with various embodiments, acts thereof and various embodiments and variations of these methods and acts, individually or in combination, may be defined by computer-readable signals tangibly embodied on a computer-readable medium, for example, a non-volatile recording medium, an integrated circuit memory element, or a combination thereof. Such signals may define instructions, for example, as part of one or more programs that, as a result of being executed by a computer, instruct the computer to perform one or more of the methods or acts described herein, and/or various embodiments, variations and combinations thereof. Such instructions may be written in any of a plurality of programming languages, for example, Java, Visual Basic, C, C#, or C++, Fortran, Pascal, Eiffel, Basic, COBOL, etc., or any of a variety of combinations thereof. The computer-readable medium on which such instructions are stored may reside on one or more of the components of a general-purpose computer described above, and may be distributed across one or more of such components.

The computer-readable medium may be transportable such that the instructions stored thereon can be loaded onto any computer system resource to implement the aspects of the present invention discussed herein. In addition, it should be appreciated that the instructions stored on the computer-readable medium, described above, are not limited to instructions embodied as part of an application program running on a host computer. Rather, the instructions may be embodied as any type of computer code (e.g., software or microcode) that can be employed to program a processor to implement the above-discussed aspects of the present invention.

Various embodiments according to the invention may be implemented on one or more computer systems. These computer systems may be, for example, general-purpose computers such as those based on Intel PENTIUM-type processor, Motorola PowerPC, Sun UltraSPARC, Hewlett-Packard PA-RISC processors, or any other type of processor. It should be appreciated that one or more of any type computer system may be used to partially or fully automate weight-based identification of 3D printed parts according to various embodiments of the invention. Further, the software design system may be located on a single computer or may be distributed among a plurality of computers attached by a communications network.

The computer system may include specially-programmed, special-purpose hardware, for example, an application-specific integrated circuit (ASIC). Aspects of the invention may be implemented in software, hardware or firmware, or any combination thereof. Further, such methods, acts, systems, system elements and components thereof may be implemented as part of the computer system described above or as an independent component.

A computer system for weight-based identification of 3D printed parts may be a general-purpose computer system that is programmable using a high-level computer programming language. The computer system may be also implemented using specially programmed, special purpose hardware. In a computer system there may be a processor that is typically a commercially available processor such as the well-known Pentium class processor available from the Intel Corporation. Many other processors are available. Such a processor usually executes an operating system which may be, for example, the Windows NT, Windows 2000 (Windows ME), Windows XP, Windows Vista or Windows 7 operating systems available from the Microsoft Corporation, MAC OS Snow Leopard, MAC OS Snow Lion operating systems available from Apple Computer, the Solaris Operating System available from Sun Microsystems, or UNIX available from various sources. Many other operating systems may be used.

The processor and operating system together define a computer platform for which application programs in high-level programming languages are written. It should be understood that the invention is not limited to a particular computer system platform, processor, operating system, or network. Also, it should be apparent to those skilled in the art that the present invention is not limited to a specific programming language or computer system. Further, it should be appreciated that other appropriate programming languages and other appropriate computer systems could also be used.

One or more portions of the computer system may be distributed across one or more computer systems coupled to a communications network. These computer systems also may be general-purpose computer systems. For example, various aspects of the invention may be distributed among one or more computer systems configured to provide a service (e.g., servers) to one or more client computers, or to perform an overall task as part of a distributed system. For example, various aspects of the invention may be performed on a client-server system that includes components distributed among one or more server systems that perform various functions according to various embodiments of the invention. These components may be executable, intermediate (e.g., IL) or interpreted (e.g., Java) code which communicate over a communication network (e.g., the Internet) using a communication protocol (e.g., TCP/IP).

It should be appreciated that the invention is not limited to executing on any particular system or group of systems. Also, it should be appreciated that the invention is not limited to any particular distributed architecture, network, or communication protocol.

Various embodiments of the present invention may be programmed using an object-oriented programming language, such as SmallTalk, Java, C++, Ada, or C# (C-Sharp). Other object-oriented programming languages may also be used. Alternatively, functional, scripting, and/or logical programming languages may be used. Various aspects of the invention may be implemented in a non-programmed environment (e.g., documents created in HTML, XML or other format that, when viewed in a window of a browser program, render aspects of a graphical-user interface (GUI) or perform other functions). Various aspects of the invention may be implemented as programmed or non-programmed elements, or any combination thereof.

Further, on each of the one or more systems that include one or more components of a system for weight-based identification of 3D printed parts, each of the components may reside in one or more locations on the system. For example, different portions of the components of a system for weight-based identification of 3D printed parts may reside in different areas of memory (e.g., RAM, ROM, disk, etc.) on the system. Each of such one or more systems may include, among other components, a plurality of known components such as one or more processors, a memory system, a disk storage system, one or more network interfaces, and one or more busses or other internal communication links interconnecting the various components.

Systems and processes disclosed herein for weight-based identification of 3D printed parts, such as a system including user interfaces 120, 130 and 150 in FIGS. 2, 3 and 4, may be implemented on a computer system described below in relation to FIGS. 7 and 8.

A system having user interfaces 120, 130 and 150 in FIGS. 2, 3 and 4 is merely an illustrative embodiment of the weight-based identification system. Such an illustrative embodiment is not intended to limit the scope of the invention, as any of numerous other implementations of the system, for example, are possible and are intended to fall within the scope of the invention. None of the claims set forth below are intended to be limited to any particular implementation of the system unless such claim includes a limitation explicitly reciting a particular implementation.

Figure 7:
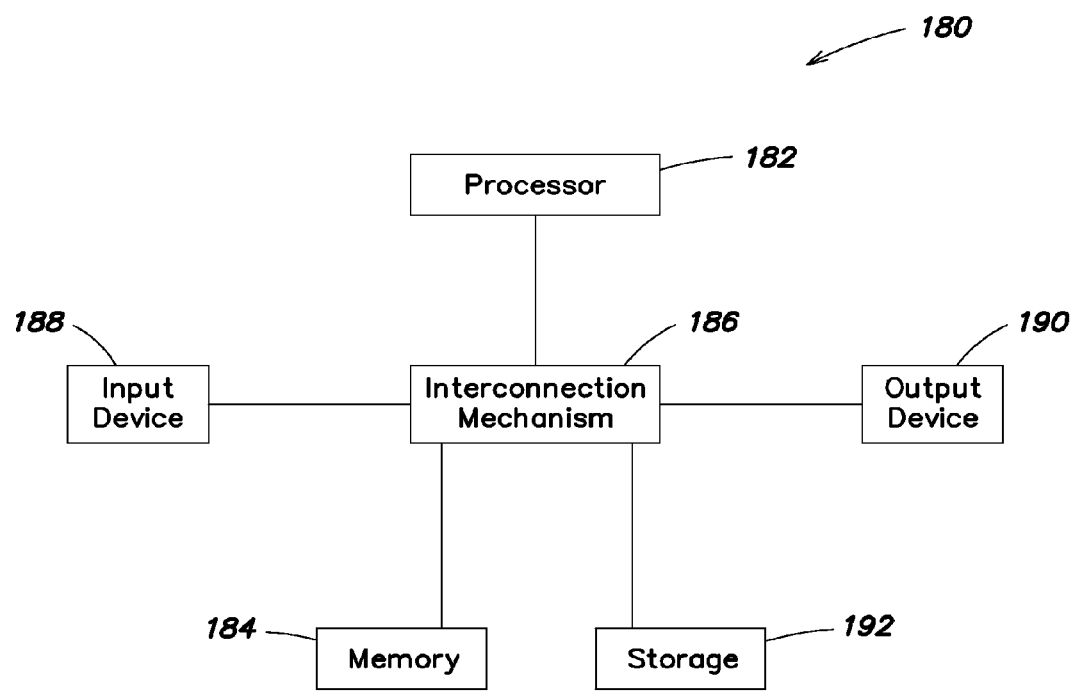
FIG. 7 is a block diagram illustrating one example of a general purpose computer system which may execute a software implementing weight-based identification of 3D printed parts according to aspects of the present invention.

Various aspects of the invention may be implemented as specialized software executing in a general-purpose computer system 180 such as that shown in FIG. 7. The computer system 180 may include a processor 182 connected to one or more memory devices 184, such as a disk drive, memory, or other device for storing data. Memory 184 is typically used for storing programs and data during operation of the computer system 180. Components of computer system 180 may be coupled by an interconnection mechanism 186, which may include one or more busses (e.g., between components that are integrated within a same machine) and/or a network (e.g., between components that reside on separate discrete machines). The interconnection mechanism 186 enables communications (e.g., data, instructions) to be exchanged between system components of system 180. Computer system 180 also includes one or more input devices 188, for example, a keyboard, mouse, trackball, microphone, touch screen, and one or more output devices 190, for example, a printing device, display screen, and/or speaker. In addition, computer system 180 may contain one or more interfaces (not shown) that connect computer system 180 to a communication network (in addition or as an alternative to the interconnection mechanism 186.

Figure 8:
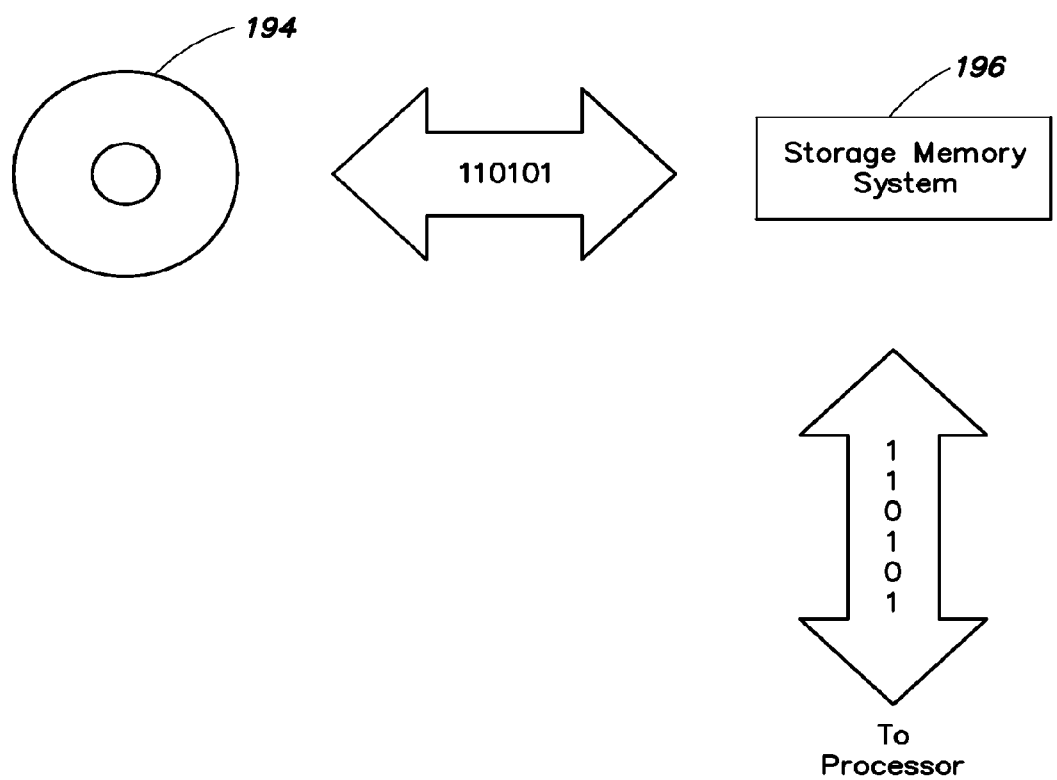
FIG. 8 is a diagram illustrating one example of a storage system of the general purpose computer system in FIG. 7.

The storage system 192, shown in greater detail in FIG. 8, typically includes a computer readable and writeable nonvolatile recording medium 194 in which signals are stored that define a program to be executed by the processor or information stored on or in the medium 194 to be processed by the program. The medium may, for example, be a disk or flash memory. Typically, in operation, the processor causes data to be read from the nonvolatile recording medium 194 into another memory 196 that allows for faster access to the information by the processor than does the medium 194. This memory 196 is typically a volatile, random access memory such as a dynamic random access memory (DRAM) or static memory (SRAM). It may be located in storage system 192, as shown, or in memory system 184, not shown. The processor 182 generally manipulates the data within the integrated circuit memory 184, 196 and then copies the data to the medium 194 after processing is completed. A variety of mechanisms are known for managing data movement between the medium 194 and the integrated circuit memory element 184, 196, and the invention is not limited thereto. The invention is not limited to a particular memory system 184 or storage system 192.

Although computer system 180 is shown by way of example as one type of computer system upon which various aspects of the invention may be practiced, it should be appreciated that aspects of the invention are not limited to being implemented on the computer system as shown in FIG. 7. Various aspects of the invention may be practiced on one or more computers having a different architecture or components that that shown in FIG. 7.

Computer system 180 may be a general-purpose computer system that is programmable using a high-level computer programming language. Computer system 180 may be also implemented using specially programmed, special purpose hardware. In computer system 180, processor 182 is typically a commercially available processor such as the well-known Pentium class processor available from the Intel Corporation. Many other processors are available. Such a processor usually executes an operating system which may be, for example, the Windows NT, Windows 2000 (Windows ME), Windows XP, Windows Vista or Windows 7 operating systems available from the Microsoft Corporation, MAC OS Snow Leopard, MAC OS Snow Lion operating systems available from Apple Computer, the Solaris Operating System available from Sun Microsystems, or UNIX available from various sources. Many other operating systems may be used.

The processor and operating system together define a computer platform for which application programs in high-level programming languages are written. It should be understood that the invention is not limited to a particular computer system platform, processor, operating system, or network. Also, it should be apparent to those skilled in the art that the present invention is not limited to a specific programming language or computer system. Further, it should be appreciated that other appropriate programming languages and other appropriate computer systems could also be used.

One or more portions of the computer system may be distributed across one or more computer systems (not shown) coupled to a communications network. These computer systems also may be general-purpose computer systems. For example, various aspects of the invention may be distributed among one or more computer systems configured to provide a service (e.g., servers) to one or more client computers, or to perform an overall task as part of a distributed system. For example, various aspects of the invention may be performed on a client-server system that includes components distributed among one or more server systems that perform various functions according to various embodiments of the invention. These components may be executable, intermediate (e.g., IL) or interpreted (e.g., Java) code which communicate over a communication network (e.g., the Internet) using a communication protocol (e.g., TCP/IP).

It should be appreciated that the invention is not limited to executing on any particular system or group of systems. Also, it should be appreciated that the invention is not limited to any particular distributed architecture, network, or communication protocol.

Various embodiments of the present invention may be programmed using an object-oriented programming language, such as SmallTalk, Java, C++, Ada, or C# (C-Sharp). Other object-oriented programming languages may also be used. Alternatively, functional, scripting, and/or logical programming languages may be used. Various aspects of the invention may be implemented in a non-programmed environment (e.g., documents created in HTML, XML or other format that, when viewed in a window of a browser program, render aspects of a graphical-user interface (GUI) or perform other functions). Various aspects of the invention may be implemented using various Internet technologies such as, for example, the well-known Common Gateway Interface (CGI) script, PHP Hyper-text Preprocessor (PHP), Active Server Pages (ASP), HyperText Markup Language (HTML), Extensible Markup Language (XML), Java, JavaScript, Asynchronous JavaScript and XML (AJAX), Flash, and other programming methods. Various aspects of the invention may be implemented as programmed or non-programmed elements, or any combination thereof.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A computer-implemented method for weight-based identification of a three dimensional (3D) printed part, the 3D printed part being printed from a 3D model using a preselected material, the method comprising acts of:
    receiving, by a computer system, an indication of a weight of the 3D printed part;
    calculating, by the computer system, a plurality of theoretical weights for a plurality of 3D models, each theoretical weight being calculated for a respective 3D model based on a volume of the respective 3D model and a density of the preselected material;
    comparing the indication of the weight to the plurality of theoretical weights; and
    selecting a subset of the plurality of 3D models based on a result of the comparing act, the subset having a size less than a total number of the plurality of 3D models.

2. The method of claim 1, further comprising acts of:
    outputting the subset; and
    receiving a selection of the 3D model corresponding to the 3D printed part from the subset.

3. The method of claim 2, further comprising an act of generating a label for the 3D printed part based on the selection of the 3D model.

4. The method of claim 3, wherein the label includes at least one of a barcode, a model number of the 3D model and an order number for the 3D printed part.

5. The method of claim 1, further comprising acts of:
receiving a selection of a tray, the 3D printed part being one of a plurality of 3D printed parts built inside the tray; and
selecting the plurality of 3D models based on the selection of the tray.

6. The method of claim 5, further comprising an act of removing a 3D model corresponding to an identified 3D printed part from the plurality of 3D models.

7. The method of claim 1, wherein the act of selecting a subset further includes an act of selecting a 3D model to include in the subset responsive to an act of determining that a deviation of the theoretical weight of the 3D model from the indication of the weight of the 3D printed part does not exceed a predetermined threshold value.

8. The method of claim 7, further comprising an act of sorting the subset based on a respective value of deviation of a respective theoretical weight of each 3D model within the subset from the indication of the weight of the 3D printed part.

9. The method of claim 1, further comprising an act of receiving the size of the subset.

10. A system for weight-based identification of a three dimensional (3D) printed part, the 3D printed part being printed from a 3D model using a preselected material, the system comprising:
a memory; and
a processing unit coupled to the memory, wherein the processing unit is operative to:
receive an indication of a weight of the 3D printed part;
calculate a plurality of theoretical weights for a plurality of 3D models, each theoretical weight being calculated for a respective 3D model based on a volume of the respective 3D model and a density of the preselected material;
compare the indication of the weight to the plurality of theoretical weights; and
select a subset of the plurality of 3D models in response to comparing the indication of the weight to the plurality of theoretical weights, the subset having a size less than a total number of the plurality of 3D models.

11. The system of claim 10, wherein the processing unit is further operative to:
output the subset; and
receive a selection of the 3D model corresponding to the 3D printed part from the subset.

12. The system of claim 11, further comprising:
a printer configured to print a label for the 3D printed part based on the selection of the 3D model.

13. The system of claim 10, wherein the processing unit is further operative to:
receive a selection of a tray, the 3D printed part being one of a plurality of 3D printed parts built inside the tray; and
select the plurality of 3D models based on the selection of the tray.

14. The system of claim 13, wherein the processing unit is further operative to:
remove a 3D model corresponding to an identified 3D printed part from the plurality of 3D models.

15. The system of claim 10, wherein the processing unit being operative to select a subset further includes the processing unit being operative to select a 3D model for inclusion in the subset responsive to a determination that a deviation of the theoretical weight of the 3D model from the indication of the weight of the 3D printed part does not exceed a predetermined threshold value.

16. The system of claim 15, wherein the processing unit is further operative to sort the subset based on a respective value of deviation of a respective theoretical weight of each 3D model within the subset from the indication of the weight of the 3D printed part.

17. The system of claim 10, wherein the processing unit is further operative to receive the size of the subset.

18. A non-transitory computer-readable storage medium that stores a set of instructions which when executed perform a method for weight-based identification of a three dimensional (3D) printed part, the 3D printed part being printed from a 3D model using a preselected material, the method executed by the set of instructions comprising:
receiving an indication of a weight of the 3D printed part;
calculating a plurality of theoretical weights for a plurality of 3D models, each theoretical weight being calculated for a respective 3D model based on a volume of the respective 3D model and a density of the preselected material;
comparing the indication of the weight to the plurality of theoretical weights; and
selecting a subset of the plurality of 3D models based on a result of comparing, the subset having a size less than a total number of the plurality of 3D models.

19. A method for weight-based identification of a three dimensional (3D) printed part, the 3D printed part being printed from a 3D model using a preselected material, the method comprising acts of:
weighing the 3D printed part to generate an indication of a weight of the 3D printed part;
calculating a plurality of theoretical weights for a plurality of 3D models, each theoretical weight being calculated for a respective 3D model based on a volume of the respective 3D model and a density of the preselected material;
comparing the indication of the weight to the plurality of theoretical weights; and
selecting a subset of the plurality of 3D models based on a result of the comparing act, the subset having a size less than a total number of the plurality of 3D models.

20. The method of claim 19, further comprising an act of identifying the 3D model corresponding to the 3D printed part from the subset of the plurality of 3D models.

21. The method of claim 20, wherein the identifying act further includes an act of visually comparing at least one 3D model in the subset to the 3D printed part.

22. The method of claim 20, further comprising an act of adding a label to the 3D printed part following the identifying act.

23. The method of claim 20, further comprising an act of routing the 3D printed part to one or more locations in response to the identifying act.

24. The method of claim 19, further comprising an act of cleaning the 3D printed part prior to the weighing act.

25. The method of claim 19, wherein the 3D printed part is one of a plurality of 3D printed parts built inside a tray, the plurality of 3D models corresponding to the plurality of 3D printed parts built inside the tray.

26. The method of claim 19, wherein the selecting act further includes an act of selecting the subset responsive to an act of determining that a deviation of a theoretical weight of a 3D model from the indication of the weight of the 3D printed part does not exceed a predetermined threshold value.

27. The method of claim 26, further comprising an act of sorting the subset based on a respective value of deviation of a respective theoretical weight of each 3D model within the subset from the indication of the weight of the 3D printed part.

28. The method of claim 19, further comprising an act of selecting the size of the subset.

* * * * *